United States Patent [19]

Rumbaugh

[11] 4,122,508
[45] Oct. 24, 1978

[54] MODULAR PRINTED CIRCUIT BOARD ASSEMBLY HAVING COOLING MEANS INCORPORATED THEREIN

[75] Inventor: Paul S. Rumbaugh, Garden Grove, Calif.

[73] Assignee: Altec Corporation, Anaheim, Calif.

[21] Appl. No.: 831,066

[22] Filed: Sep. 6, 1977

[51] Int. Cl.$^2$ .............................................. H05K 7/20
[52] U.S. Cl. .................................. 361/384; 361/415; 165/80
[58] Field of Search ............................... 361/393–395, 361/415, 383, 384; 174/16 R, 16 HS; 165/80, 166

[56] References Cited

U.S. PATENT DOCUMENTS

| 3,648,113 | 3/1972 | Ruthjen | 174/15 R |
|---|---|---|---|
| 3,760,233 | 9/1973 | Warwick | 361/415 |
| 3,780,798 | 12/1973 | Reimer | 361/383 |
| 3,950,057 | 4/1976 | Calabro | 361/415 |
| 4,027,206 | 5/1977 | Lee | 165/80 |

Primary Examiner—Gerald P. Tolin
Attorney, Agent, or Firm—Edward A. Sokolski

[57] ABSTRACT

A modular printed circuit board assembly has a plurality of printed circuit boards each of which is integrated with a separate heat sink to form a modular unit. Each such modular unit is removably supported in a housing on a separate pair of support tracks in the base and top cover of the housing, bottom edges of the printed circuit board and a runner formed on the edge of the heat sink riding in these tracks. Each of the heat sinks has a flange portion to which the associated printed circuit board is attached and on which elements such as power transistors which generate a substantial amount of heat are directly mounted. The main body portion of each heat sink has a plurality of fins in the form of longitudinal strips with longitudinal slots being formed between the fins. The printed circuit boards and their associated heat sinks joined together to form integral units are installed on the chassis in side-by-side relationship with the fins and slots in alignment with each other such that the slots of adjacent heat sinks form longitudinal channels. Continuous air circulation is provided through the channels thus formed by means of a blower which communicates with the ambient air and is positioned along the channels at one end of the stack of heat sinks and an outlet to the ambient air positioned along the channels at the other end of the heat sink stack, thereby affording a high flow of cooling air through the heat sinks.

7 Claims, 7 Drawing Figures

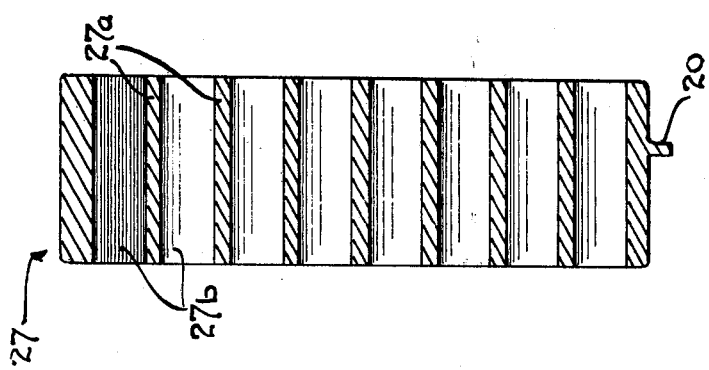
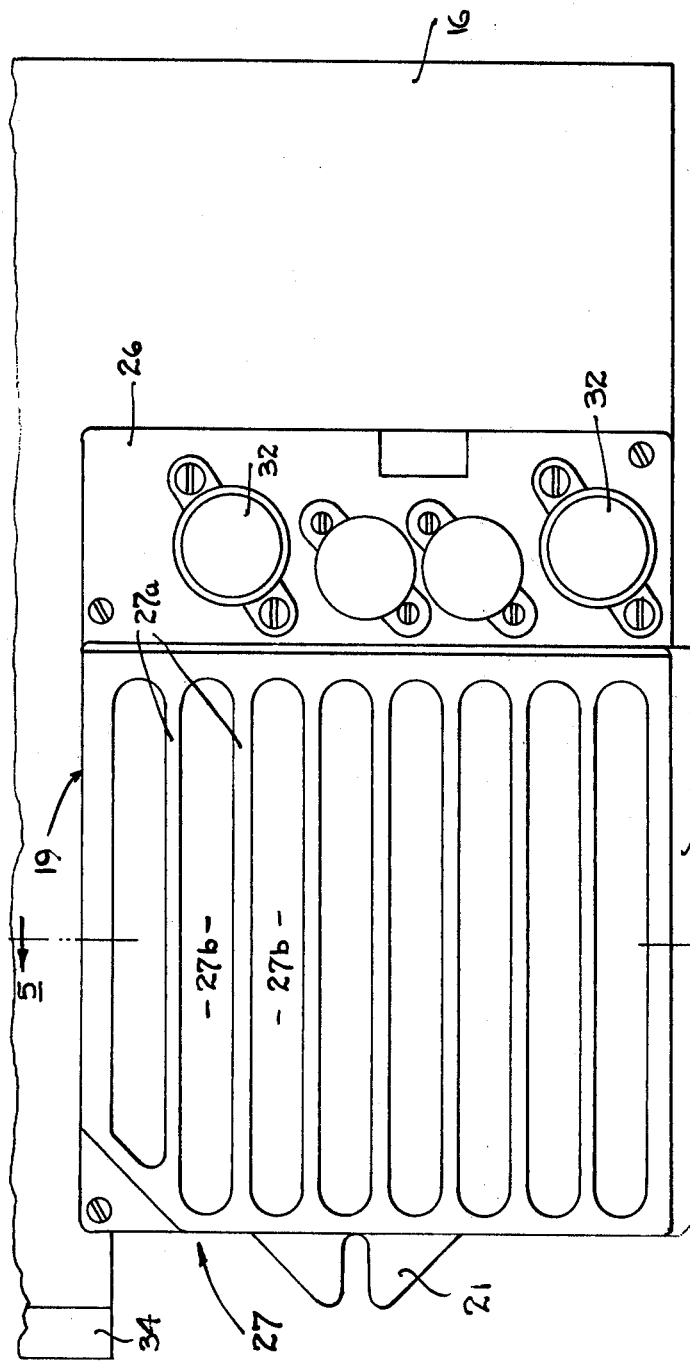
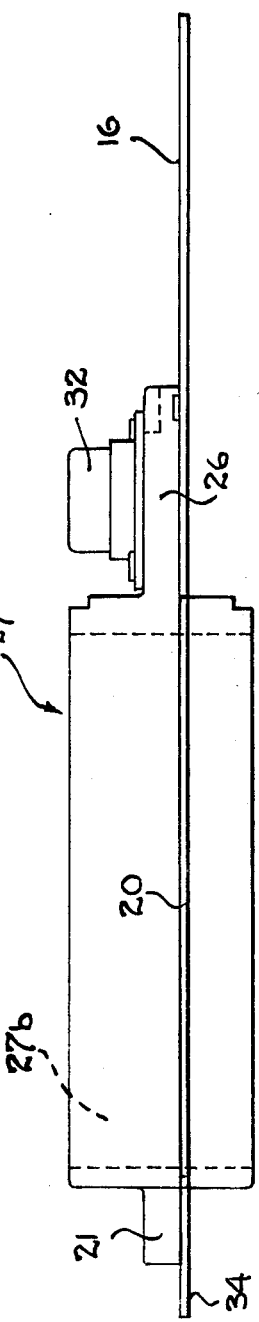

MODULAR PRINTED CIRCUIT BOARD ASSEMBLY HAVING COOLING MEANS INCORPORATED THEREIN

This invention relates to cooling systems for printed circuit boards and more particularly to such a system suitable for use in modular printed circuit board assemblies.

Printed circuit board assemblies employing modular construction have come into widespread use in recent years. This type of assembly affords an advantage in that it lends itself to compact construction. However, where a plurality of printed circuit boards are mounted closely together inside of a cabinet, overheating can present a serious problem, particularly where power circuits are involved, as for example in audio power amplifiers and the like. To overcome this problem, various types of heat devices for circuit boards have been devised, these heat sink devices operating in conjunction with air cooling systems. Prior art systems of this general type as employed with modular printed circuit board assemblies and other modular assemblies are described, for example, in U.S. Pat. Nos. 3,790,859 to Schraeder et. al.; 2,942,856 to Woodward et al.; and 3,648,113 to Rathjen et al. In these prior art systems, the cooling air is generally fed into a channel formed along one side of the modular units which functions as a plenum and from here flows in parallel streams across surfaces of each of the modular units to an outlet channel generally located along another side of the units.

The system of the present invention provides an improvement in cooling by concentrating the cooling action on the heat sink elements, this being achieved by providing a high rate of air flow directly through such elements thereby providing highly efficient cooling action in this region, the high heat dissipating elements being mounted directly on these heat sink elements. This end result is achieved in the system of this invention with a very simple type construction which requires no complicated plenum arrangements. Further, in the system of the present invention, modular units can be added or removed without affecting the efficiency of the cooling operation and without the need for any modification of the system.

It is therefore an object of this invention to provide an improved cooling system for a modular printed circuit board assembly.

It is a further object of this invention to provide a modular printed circuit board assembly wherein modular units can be added or removed without significantly affecting the cooling system.

Still another object of this invention is to provide a modular printed circuit board assembly incorporating an efficient cooling system which is of simple construction.

Other objects of this invention will become apparent as the description proceeds in connection with the accompanying drawings, of which:

FIG. 3 is a plan view of a modular printed circuit board-heat sink unit of the preferred embodiment;

FIG. 4 is a side elevational view of the printed circuit board-heat sink unit of FIG. 3; and FIG. 5 is a cross sectional view taken along a plane indicated by 5—5 in FIG. 3.

Briefly described, the system of my invention is as follows:

A modular printed circuit board assembly is formed from a plurality of printed circuit board-heat sink units. Each of such printed circuit board-heat sink units comprises a heat sink element having a tongue or flange portion which is in the form of a flat plate and a main body portion. The main body of the heat sink has a plurality of longitudinal cooling fins which may be in the form of longitudinal strips between which openings are formed. A printed circuit board is attached to the flange portion to form an integral unit with the heat sink. A series of pairs of transversely extending tracks are located in the base and top cover of a housing for the modular units, the modular units are being mounted in the tracks in side-by-side relationship with the bottom edges of the boards and runners formed along the top edges of the heat sinks riding in the associated bottom and top tracks respectively. With the modular units installed in the housing in side-by-side relationship, the openings of the heat sink elements are aligned with each other such as to form a plurality of channels extending through from one side of the stack of elements to the other. A blower is placed on one side of the elements and an air vent on the other to provide a continuous flow of air from the outside across the fins of the heat sinks.

Figure 1B:
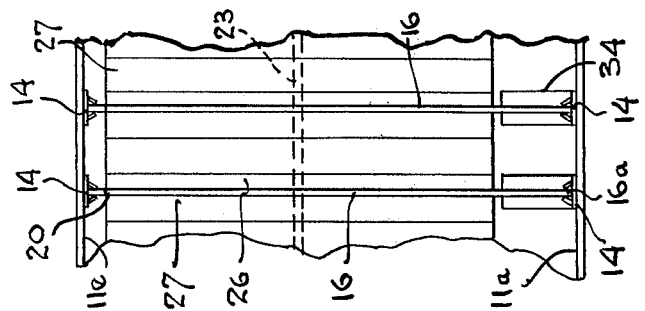
FIG. 1B is a fragmentary view illustrating the engagement of the heat sinks and circuit boards with the support tracks of the housing in the preferred embodiment.
Figure 1:
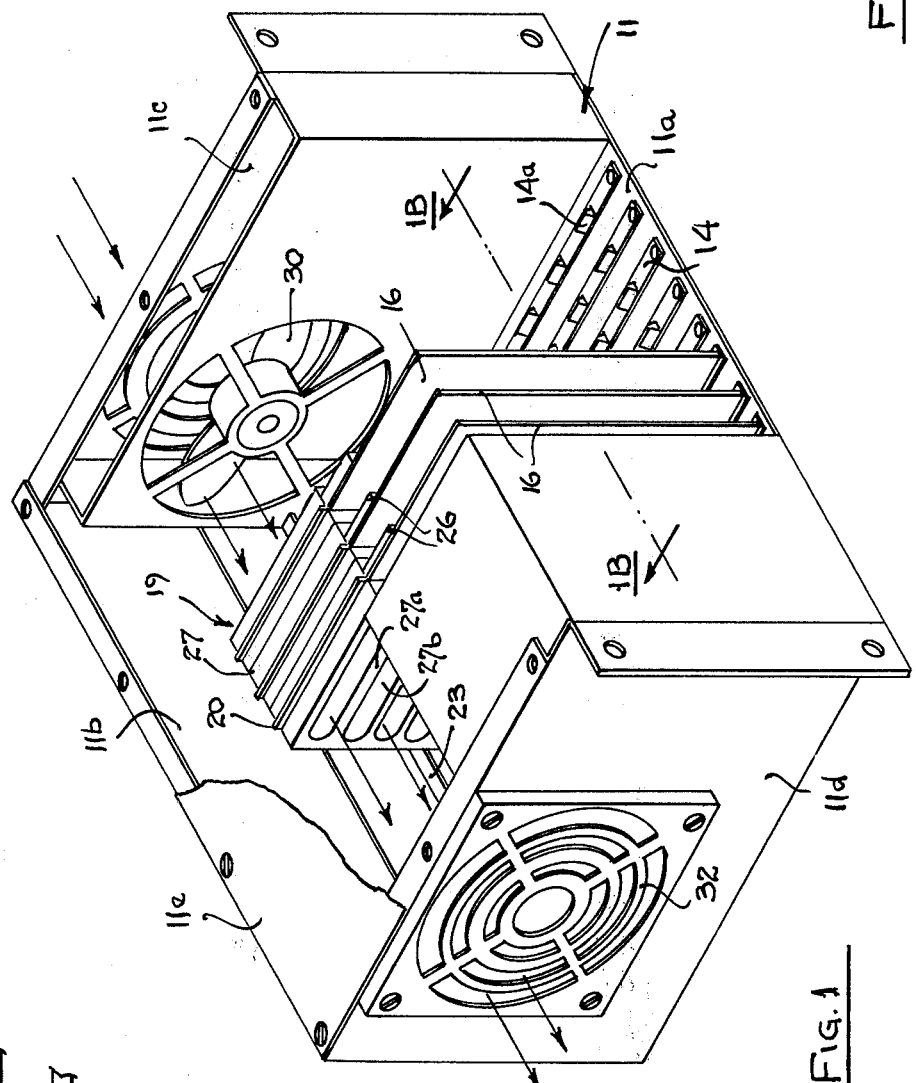
FIG. 1 is a perspective view illustrating a preferred embodiment of the system of the invention.
Figure 1A:
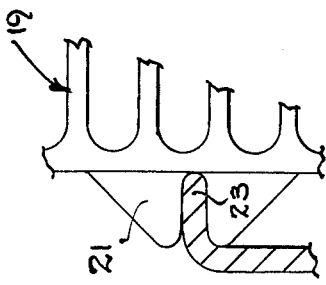
FIG. 1A is a fragmentary view illustrating the engagement of the heat sink on the housing rail in the preferred embodiment.

Referring now to FIGS. 1, 1A and 1B, a preferred embodiment of the system of the invention is illustrated. Housing 11 has a plurality of pairs of tracks 14 for each modular unit, these tracks running transversely across the base portion 11a and the top cover portion 11e of the housing. Each of the tracks 14 has a plurality of clamping elements 14a through which the bottom edge portions of printed circuit boards 16 and the runners 20 of heat sinks 19 (see FIGS 3-5) ride while the units are being installed and by means of which they are retained in position once installed. A hook 21 is provided along the forward edge of each of heat sinks 19, this hook fitting on rail 23 which runs along back wall 11b of housing 11, so as to restrain movement of the installed units. As to be explained in further detail in connection with FIGS. 2-5, each of heat sinks 19 has a flange or tongue portion 26 to which an associated printed circuit board 16 is attached and a main body portion 27 having a plurality of longitudinal plates forming cooling fins 27a with slots 27b being formed therebetween. A blower 30 which may be driven by an electrical motor is mounted on wall 11c of the housing while an air vent 32 is mounted on the opposite wall 11d thereof. A connector plug 34 is provided along the inner edge of each board to provide electrical connections from the boards to mating receptacles (not shown) mounted on wall 11b of the housing.

With the printed circuit board-heat sink assemblies in their installed positions, corresponding slots 27b of the side-by-side units are aligned with each other to form a plurality of channels running through from one side of the stack of units to the other, thus providing straight through air channels running between blower 30 and vent 32 for the efficient circulation of air past fins 27a. Thus, highly efficient cooling of the heat sinks is afforded. It is further to be noted that if one or more of the printed circuit board-heat sink units is removed, this does not affect the flow through the remaining units. Also, additional units can be added to the stack with the same efficient through flow of air still being achieved.

Figure 2:
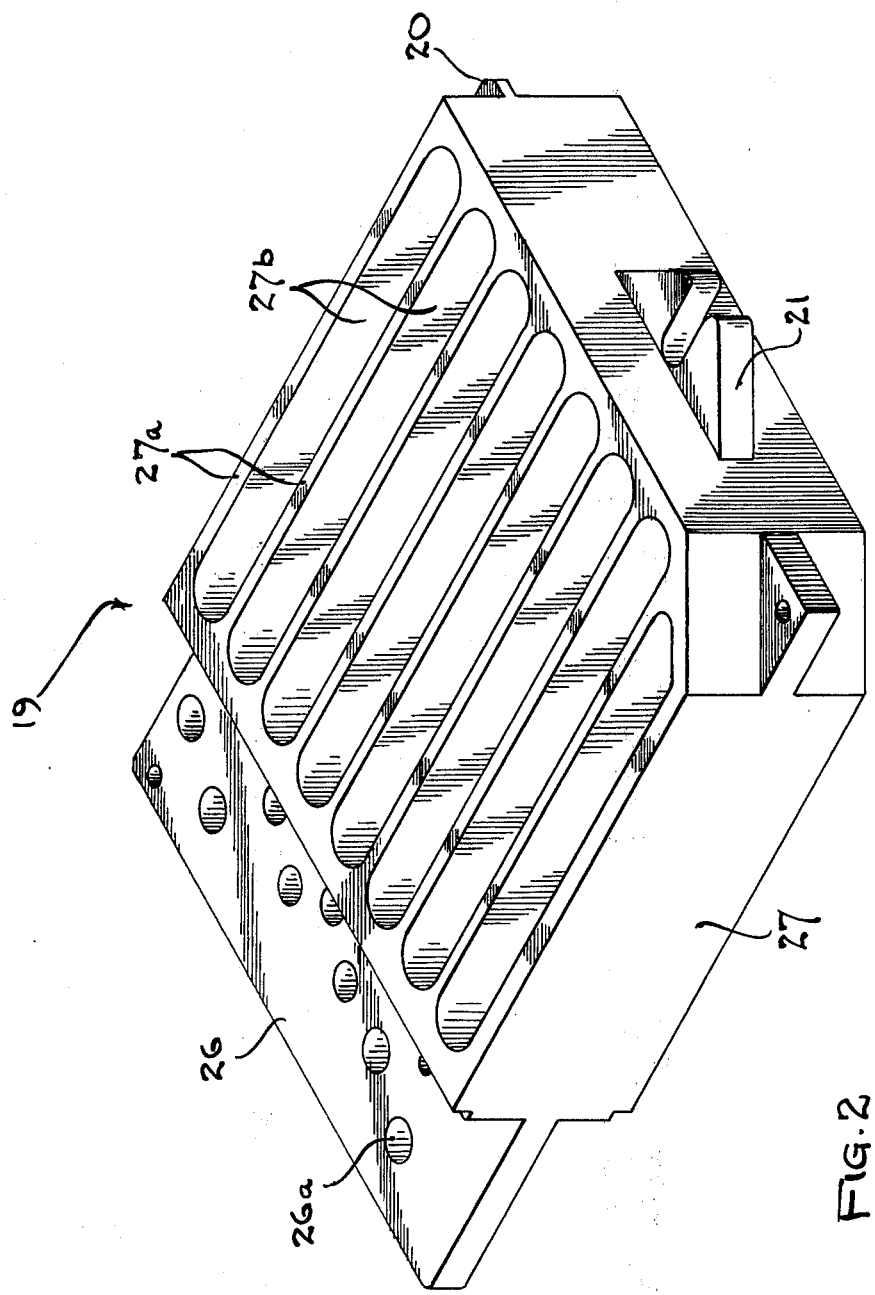
FIG. 2 is a perspective view of a heat sink element of the preferred embodiment.

Referring now to FIG. 2, the heat sink of the preferred embodiment is illustrated. Each heat sink comprises a main body portion 27 and a flange or tongue portion 26 which extends from the main body portion. Flange portion 26 is in the form of a flat plate and has a plurality of mounting holes 26a formed therein for facilitating the mounting of components having high heat dissipation such as power transistors and the like and the attachment of the printed circuit boards thereto. Main body portion 27 has a plurality of longitudinal fins 27a which are in the form of flat plates forming webs between which longitudinal channels 27b are formed. Formed along a top edge of heat sink element 19 is a runner 20 which, as already noted, rides in a track formed in the top cover of the housing. Along the forward wall of heat sink 19, a hook member 21 is provided for assisting the retention of the modular unit in the housing. The heat sink may be a cast unit with the main body portion in the general form of a block with the channels being formed by longitudinal cutouts in the block.

Referring now to FIGS 3-5, the attachment of the printed circuit board 16 to the heat sink to form an integral unit is shown. Printed circuit board 16 is attached to flange portion 26 of the heat sink by suitable bolts or the like (not shown). Mounted directly on tongue portion 26 are components which have relatively high heat dissipation such as power transistors 32. As can be seen in FIGS. 1 and 1B, the bottom edge 16a of board 16 forms a continuous runner for use in installing the units in the tracks while runners 20 of the heat sinks run in the tracks on cover 11. The heat sinks 19 should be fabricated of a material having high heat conductivity such as a suitable aluminum alloy.

The present invention thus provides means for implementing a modular printed circuit board assembly having highly efficient cooling and which is adapted for use with a greater or lesser number of modular elements as application requirements may dictate. This assembly is particularly suited for use in an audio power amplifier having high power requirements such as, for example, a theatre, auditorium or standing public address system.

While the invention has been described and illustrated in detail, it is to be clearly understood that this is by way of illustration and example only and is not to be taken by way of limitation, the spirit and scope of this invention being limited only by the terms of the following claims.

I claim:

1. A modular printed circuit board assembly comprising:

a plurality of similar modular units, each of said units including a heat sink element having a main body portion in the form of a plurality of cooling fins between which openings are formed and a flange portion in the form of a plate which extends from the main body portion; and a printed circuit board attached to the flange portion to form an integral unit with the heat sink element, a housing having a base and top cover for said modular units, means for removably supporting said modular units in said housing in side by side relationship to form a stack with corresponding openings in said modular units aligned with each other in series to form a plurality of parallel unimpeded channels extending through said stack from one side to the opposite side thereof, and means for circulating ambient air through said channels comprising a blower mounted in a wall of said housing at one end of said channels and a vent mounted in a wall of said housing opposite said first mentioned wall at the other end of said channels, whereby air streams are flowed in substantially straight lines from outside said housing across the fins and out from the housing through the vent.

2. The printed circuit board assembly of claim 1 wherein said cooling fins are in the form of longitudinal strips between which longitudinal slots are formed.

3. The assembly of claim 1 wherein the means for supporting the modular units in the housing comprises a pair of tracks for each of said units located in the base and top cover of said housing, the main body portion of each of the heat sinks having a runner along the edge thereof, said tracks having clamping means therein for clamping said heat sink runners to the top cover of said housing and one of the edges of said circuit boards to the base of said housing.

4. The assembly of claim 3 wherein said means for supporting the modular units further includes a hook along the forward edge of the main body portion of the heat sinks and a rail running along the back wall of the housing, said hooks engaging said rail.

5. The printed circuit board assembly of claim 1 and further including components having high heat dissipation mounted directly on the flange portion of said heat sink element.

6. The printed circuit board assembly of claim 1 wherein the means for circulating ambient air through said channels comprises a blower located on one of the ends of said channels and on air vent located on the other of the ends of said channels.

7. The printed circuit board assembly of claim 1 wherein the main body portion of the heat sink is in the general form of a block, the openings being longitudinal cutouts forming slots in said block, the fins being in the form of longitudinal flat plates forming webs separating said channels.

* * * * *

REEXAMINATION CERTIFICATE (47th)

United States Patent [19]

Rumbaugh

[11] B1 4,122,508

[45] Certificate Issued Jan. 25, 1983

[54] MODULAR PRINTED CIRCUIT BOARD ASSEMBLY HAVING COOLING MEANS INCORPORATED THEREIN

[75] Inventor: Paul S. Rumbaugh, Garden Grove, Calif.

[73] Assignee: Altec Corporation, Anaheim, Calif.

Reexamination Request

No. 90/000,049, Aug. 7, 1981

Reexamination Certificate for:
Patent No.: 4,122,508
Issued: Oct. 24, 1978
Appl. No.: 831,066
Filed: Sep. 6, 1977

[51] Int. Cl.³ .......................................... H05K 7/20
[52] U.S. Cl. ..................................... 361/384; 361/415
[58] Field of Search...361/393–395, 415, 383, 384, 361/386, 388; 174/16 R, 16 HS; 165/80 R, 80 A, 80 B, 80 D, 165/166, 185.

[56] References Cited

U.S. PATENT DOCUMENTS

| | | | |
|---|---|---|---|
| 1,959,513 | 5/1934 | Weyandt | 219/8 |
| 3,198,991 | 8/1965 | Barnett | 361/384 |
| 3,277,346 | 10/1966 | McAdam et al. | 361/384 |
| 3,305,704 | 2/1967 | Battista | 361/384 |
| 3,648,113 | 3/1972 | Rath Jen | 174/15 R |
| 3,760,233 | 9/1973 | Warwick | 361/415 |
| 3,780,798 | 12/1973 | Reimer | 361/383 |
| 3,950,057 | 4/1976 | Calabro | 361/415 |
| 4,027,206 | 5/1977 | Lee | 361/384 |

OTHER PUBLICATIONS

"Electronics Diversified", pp. 61–70 of Prior Art Statement, also Exhibits A, B, C, D of Requestor's Reply, 1975 (Rasmussen Declaration), Also EDI Heat Sinks, Requestor's Reply, 1/8/76, pp. 1 and 2.

DBX, New 900 Series—System, p. 72, no prior date, in Prior Art Submission.

(List continued on next page.)

*Primary Examiner*—Gerald P. Tolin

[57] ABSTRACT

A modular printed circuit board assembly has a plurality of printed circuit boards each of which is integrated with a separate heat sink to form a modular unit. Each such modular unit is removably supported in a housing on a separate pair of support tracks in the base and top cover of the housing, bottom edges of the printed circuit board and a runner formed on the edge of the heat sink riding in these tracks. Each of the heat sinks has a flange portion to which the associated printed circuit board is attached and on which elements such as power transistors which generate a substantial amount of heat are directly mounted. The main body portion of each heat sink has a plurality of fins in the form of longitudinal strips with longitudinal slots being formed between the fins. The printed circuit boards and their associated heat sinks joined together to form integral units are installed on the chassis in side-by-side relationship with the fins and slots in alignment with each other such that the slots of adjacent heat sinks form longitudinal channels. Continuous air circulation is provided through the channels thus formed by means of a blower which communicates with the ambient air and is positioned along the channels at one end of the stack of heat sinks and an outlet to the ambient air positioned along the channels at the other end of the heat sink stack, thereby affording a high flow of cooling air through the heat sinks.

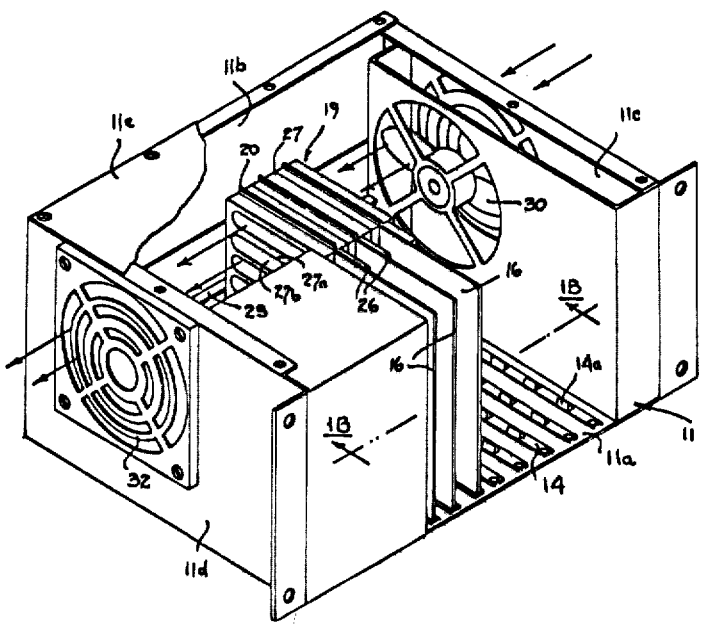

TOA Electric Co. Ltd., Preamp mixer, pp. 73, 74, no prior date, in Prior Art Submission.

Spectra Sonics, Model 201C Card Holder, p. 75, no prior date, in Prior Art Submission.

Spectra Sonics, Model 202PC 5/2/72 document VIII, and IX—1972 Price List, in Requestor's Reply.

Sennheiser, Revue 10, p. 76, no prior date, in Prior Art Submission.

WEI Corp., (1) Extrusion Listing, (2) Heat Dissipated Components, pp. 77, 78, no prior date, in Prior Art Submission.

Aham-tor, Series (1) 6050 Heat Sinks, (2) Series 6070, (3) Series 6060, pp. 79-81, no prior date, in Prior Art Submission.

Astrodyne, Inc., Models 2403, 2404, p. 82, no prior date, in Prior Art Submission.

B&T Metals Co., Heat Sinks (3 pages-documents I (4/18/72), II (6/8/73) and III (7/1/74), Requestor's Reply.

Wakefield Engineering, Semi Conductor Cooling Packages, 3 pages, documents IV, V, VI, 1972, 3, 4, Requestor's Reply.

Bi and Tri Amplification, Siniscal, Recording-Engineer Producer, April 1971, pp. 27-29, Requestor's Reply.

Spectra Sonics, Model 700 Power Amplifier, Requestor's Reply, 1969 (Mr. Dilley Declaration), document VII Price List 5/2/72.

Preston, Precision Starts Up Front, 6/5/72, p. 30, Requestor's Reply, Anaheim, California.

Tektronics, Tektronics 7904, 6/5/72, p. 45, Requestor's Reply, Beaverton, Oregon.

Honeywell, Complete Data Graphic System, 8/28/72, Requestor's Reply.

Tektronics, TM 500 Series, 8/14/72, p. 155, Requestor's Reply, Beaverton, Oregon.

Product Brochures by DBX, TOA, Spectra Sonics, Sennheiser, WEI Corp, Aham, and Astrodyne, Inc., pp. 72-82.

REEXAMINATION CERTIFICATE ISSUED UNDER 35 U.S.C. 307.

THE PATENT IS HEREBY AMENDED AS INDICATED BELOW.

Matter enclosed in heavy brackets appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended:

1. A modular printed circuit board assembly comprising:
   a plurality of similar modular units, each of said units including a heat sink element having a main body portion in the form of a plurality of cooling fins between which openings are formed and a flange portion in the form of a plate which extends from the main body portion; and a printed circuit board attached to the flange portion to form an integral unit with the heat sink element,
   a housing having a base and top cover for said modular units,
   means for removably supporting said modular units in said housing in side by side relationship to form a stack with corresponding openings in said modular units aligned with each other in series to form a plurality of parallel unimpeded channels extending through said stack from one side to the opposite side thereof, *all of said channels being substantially parallel to each other,* and
   means for circulating ambient air *from outside the housing* through said channels *and out from the housing in substantially unidirectional straight lines* comprising a blower mounted in a wall of said housing at one *open* end of *all of* said channels and a vent mounted in a wall of said housing opposite said first mentioned wall at the other *open* end *of all* of said channels, *each of said channels being directly aligned longitudinally in a substantially straight line path between said blower and said vent,* whereby air streams are flowed in substantially *unidirectional* straight lines from outside said housing across the fins and out from the housing through the vent.

Claims 2–7, dependent on amended claims, are determined to be patentable.

* * * * *